United States Patent [19]

Altman et al.

[11] 3,924,320

[45] Dec. 9, 1975

[54] METHOD TO IMPROVE THE REVERSE LEAKAGE CHARACTERISTICS IN METAL SEMICONDUCTOR CONTACTS

[75] Inventors: Carl Altman, La Grangeville; Sydney G. Chapman, Poughkeepsie; Akella V. S. Satya, Wappingers Falls, all of N.Y.

[73] Assignee: International Business Machines Corporation, Armonk, N.Y.

[22] Filed: Oct. 18, 1974

[21] Appl. No.: 516,236

Related U.S. Application Data

[62] Division of Ser. No. 244,157, April 14, 1972, abandoned.

[52] U.S. Cl. ....................... 29/578; 29/590; 29/580; 357/15; 357/91

[51] Int. Cl.$^2$ ........................................... B01J 17/00

[58] Field of Search .......... 29/576 B, 580, 590, 578; 357/91, 15

[56] References Cited

UNITED STATES PATENTS

| | | | |
|---|---|---|---|
| 3,635,767 | 1/1972 | Tsuchimoto | 357/91 |
| 3,681,220 | 8/1972 | Chizinsky | 357/91 |
| 3,801,390 | 4/1974 | Lepselter | 357/91 |

*Primary Examiner*—W. Tupman

*Attorney, Agent, or Firm*—Wesley DeBruin

[57] ABSTRACT

A method for improving the reverse leakage characteristics in metal semiconductor contact devices is disclosed. The process embodies ionic plasma bombardment as a step in producing improved reverse bias current voltage characteristics between metal semiconductor contacts.

1 Claim, 7 Drawing Figures

METHOD TO IMPROVE THE REVERSE LEAKAGE CHARACTERISTICS IN METAL SEMICONDUCTOR CONTACTS

This application is a division of application Ser. No. 244,157, filed on Apr. 14, 1972, by Carl Altman, Sydney G. Chapman and Akella V. S. Satya for "Device and Method to Improve the Reverse Leakage Characteristic in Metal Semiconductor Contacts". Application Ser. No. 244,157 has been abandoned.

CROSS REFERENCE TO RELATED APPLICATIONS

U.S. patent application Ser. No. 516,548, filed Oct. 21, 1974, by Carl Altman, Sydney G. Chapman and Akella V. S. Satya for "Device and Method to Improve the Reverse Leakage Characteristics in Metal Semiconductor Contacts". Ser. No. 516,548 is a continuation application of Ser. No. 244,157, filed Apr. 14, 1972, now abandoned.

BACKGROUND OF THE INVENTION

1. Field of the Invention

Ordinary P-N semiconductor diode junctions customarily exhibit low reverse leakage characteristics revealed by a constant saturation current until Zener and avalanche-type breakdown mechanisms develop with increased reverse bias. This characteristic is observed as a rounded voltage versus a current curve or soft breakdown on an oscilloscope presentation where the reverse leakage rapidly increases non-linearly as contrasted with an ideal "square" curve where the junction exhibits an almost constant saturation leakage current until the breakdown voltage is applied across the junction. The ideal metal N-type semiconductor Schottky barrier diodes also exhibits similar reverse current-voltage characteristics. Semiconductor diodes are believed to have a breakdown voltage characteristic whenever sufficient reverse voltage is applied in that as the voltage is raised the current increases much more rapidly than in normal almost non-conducting reverse region. Theoretically, it is possible to make a junction in which the breakdown characteristic is not soft. The diode then has a very low incremental resistance in the breakdown region and the voltage drop varies very little over a wide range of current. This situation is applicable to P-N junction diodes as well as metal N-type semiconductor contact diodes. Nevertheless, a junction in a conventional diode does exhibit a certain amount of current leakage which accounts for the "soft knee" aspects of the curve. While the factors responsible for this soft behavior are not completely understood, they seemingly are associated with edge effects and surface effects and defects in the body of the junction. These detrimental effects are reduced by conventional guard ring structures.

In metal semiconductor contacts associated with the covalent semiconductors of Group IV such as silicon and germanium and the III–V compounds such as gallium arsenide, the barrier height is relatively insensitive to the metal work function and also to the semiconductor work function, contrary to the Schottky Model because of the pinning of the Fermi level at the semiconductor surface about one-third the energy gap above the valence bond. This is believed to be due to surface states.

However, qualitatively, metals with a work function higher than the semiconductor material, for example, platinum, gold, palladium and aluminum are expected to reveal good metal semiconductor barrier diodes on N-type semiconductors. Similarly, the low work function metals such as hafnium, magnesium and zirconium are expected to give similar results on P-type semiconductor materials but, generally the reverse leakage currents are higher than those on N-type semiconductor materials. The closer are the metal and semiconductor work function values, the lower are the barrier heights and consequently the reverse leakage characteristics will be larger.

Current-voltage characteristics can be observed on a curve tracer, and more accurately, with a function generator or a sensitive constant current source across a diode and a high impedence voltage detector and picoammeter or oscilloscope type arrangement.

Metal semiconductor diodes are commonly used as emitter base clamping diodes in switching currents, as protective diodes in FET circuits and in high frequency circuits. The original type of Schottky barrier diode employed a spring-like metal whisker having a very small flat tip which is pressed against the surface of the semiconductor crystal. The contact between the metal and the semiconductor provides the potential barrier which produces the diode. This type of construction is most suitable for high frequency applications because the area of the barrier formed between the metal and the semiconductor can be made very small and the opposed area of the conductor adjacent to the barrier is only equal to the cross-sectional area of the whiskers so that the stray capacitance of the diode is held to a minimum.

The metal semiconductor contacts yield rectifying properties due to the barrier which is determined by the difference in the respective work functions of the contacting metallic layer and semiconductor bodies and also the effect of semiconductor surface states in the case of covalent semiconductors. The metal semiconductor contact yields a contact potential difference which must be overcome to support conduction. In operation, barrier diodes exhibit unilateral conduction characteristics similar to those exhibited by P-N semiconductor diodes. However, the reverse leakage currents, being barrier dependent, are in general much higher, especially on P semiconductors.

2. Description of the Prior Art

It is well known that metal semiconductor contacts yield non-rectifying characteristics when the semiconductor contact region is of low resistivity (high surface dopant concentration) and rectifying characteristics on high resistivity regions. The theory of metal semiconductor barrier diodes is a known phenomenon dating back many years. However, until recently, the use of metal-semiconductor barrier diodes in monolithic semiconductor circuits form has been limited due to considerations of yield, performance and compatibility with existing monolithic processes.

As is well known in the prior art, the primary electrical characteristics of a classical metal semiconductor barrier diode are determined principally by the difference in work function between the metal and the semiconductor substrate upon which it is formed. It has not been possible previously to obtain metal P-type semiconductor diode reverse characteristics as good as those on N-type semiconductor material even with proper choice of low work function material. Thus, when attempting to implement metal semiconductor barrier diodes in monolithic form for various circuit applications, it is often necessary to use different type metals to form different barrier diodes depending upon their particular circuit applications, which again is limited by the particular work function of the single metal employed and the semiconductor substrate. This requirement poses an extreme hardship in high volume integrated circuit manufacturing lines.

Also, the incorporation of barrier diodes into monolithic circuits has been impeded due to the fact that many of the metals necessary to form a particular barrier diode having the desired electrical characteristics are of a particular metal which is incompatible with the integrated circuit interconnection metallurgical systems of the user. Therefore, the processes involved are costly.

SUMMARY OF THE INVENTION

Therefore, it is an object of the present invention to provide a metal semiconductor barrier diode which is simple to fabricate in monolithic form and reliable in both the forward and reverse biased conditions on both N-type and P-type covalent semiconductors.

Another object of the present invention is to provide a metal semiconductor barrier diode which is also compatible with known metallurgical interconnection technologies.

A further object of the present invention is to provide a metal semiconductor barrier diode comprised of a fixed metallurgical system which exhibits characteristic current voltage curves suitable for application in multi-functioned integrated circuits, both memory and logic.

In accordance with the above-mentioned objects, the present invention provides a metal semiconductor barrier diode suitable for implementation in monolithic form in multi-functional integrated circuits, memory and logic, comprising a semiconductor substrate containing both N- and P-type regions and a more than one metal system contacting the semiconductor substrate for forming metal semiconductor barrier diode junctions.

The foregoing and other objects, features and advantages of the invention will be apparent from the following more particular description of the preferred embodiments of the invention as illustrated in the accompanying drawings, and are broadly accomplished by a method for producing metal semiconductor contact diodes on both P and N type semiconductor material which are not significantly dependent on the work function of the metal and the semiconductor material and whereby metal semiconductor contact diode devices are formed with or without any type of edge effect guard ring upon a semiconductor substrate by the following process steps:

a. providing a semiconductor substrate having an epitaxial layer theron and covered by a suitable insulating or oxide film;
b. opening a contact area or window through said oxide layer;
c. subjecting the contact area to low energy ionic bombardment, and
d. depositing metal therein in contact with said semiconductor material.

BRIEF DESCRIPTION OF THE PREFERRED EMBODIMENTS

Figure 1A:
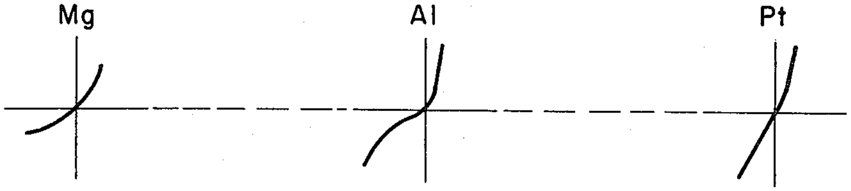
FIG. 1A illustrates current voltage characteristic curves of metal semiconductor diodes produced on P-type semiconductor materials in accordance with prior art methods.
Figure 1B:
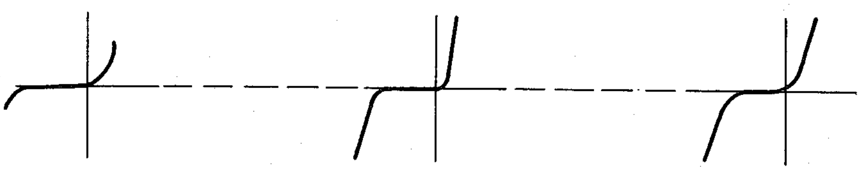
FIG. 1B illustrates current voltage characteristic curves of metal semiconductor diodes produced in accordance with this invention, utilizing the same semiconductor and metal materials.

FIG. 1A is illustrative current voltage curves comparing diodes produced in accordance with the prior art methods showing the conventional soft knee reverse bias characteristics of metal semiconductor diodes on P type substrates. FIG. 1B has the same characteristics of metal P-type semiconductor diodes produced in accordance with this invention.

Figure 2:
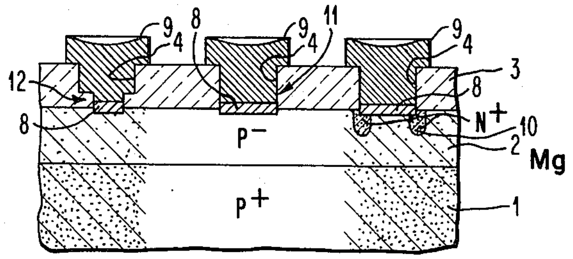
FIG. 2 is a cross-sectional view of three semiconductor devices illustrating magnesium metal semiconductor diode with a MOS type guard ring, without guard ring, and with diffused guard ring structures.
Figure 3:
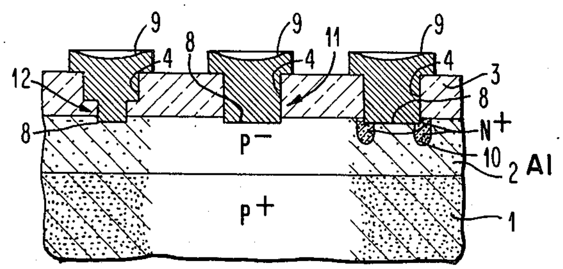
FIG. 3 is a cross-sectional view of semiconductor devices illustrating an aluminum metal semiconductor diode of similar structure illustrated in FIG. 2.
Figure 4:
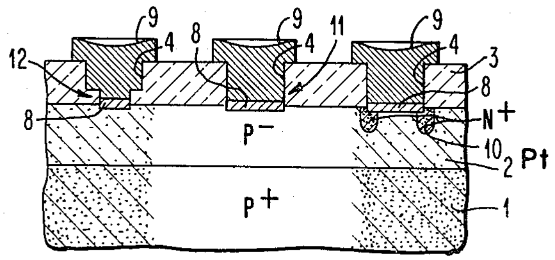
FIG. 4 is a cross-sectional view of a semiconductor device illustrating a platinum silicide semiconductor diode of similar structure illustrated in FIG. 2.

Referring to the non-guard ring structure shown centrally in FIGS. 2, 3, and 4, typically a P-type substrate 1 is provided with an expitaxial layer 2 of 2 to 3 microns thick, upon which an oxide or insulating layer 3 is grown in the magnitude of 3000A thickness. The oxide layer is selectively etched utilizing photoresist and etchant to open an area through to the semiconductor material. This is known in the art as a diffusion or metallization window. These openings are illustrated at 4 in the above-mentioned figures. These etched or otherwise provided contact areas are subjected to low energy ionic bombardment utilizing illustrative apparatus shown in FIG. 6 wherein a wafer or substrate 5 is supported at 6 in an evacuated chamber 7 wherein a plasma state of an inert atmosphere such as argon is supported between an RF electrode 13 and an annular ground plate 14. The wafer is subjected to ion bombardment from the said plasma by means of a negative DC bias on the wafer 5. The bombardment treatment is followed by metal deposition utilizing an electron beam gun or any other suitable mechanism. The metal is deposited into the hole 4 to produce a metal semiconductor contact at 8. FIGS. 2, 3, and 4 illustrate the metal semiconductor contact devices using magnesium, aluminum and platinum as the contact metals. Interconnection metallurgy, for example, aluminum if different from the said contact metal is deposited at 9 to complete the device formation.

The devices illustrated are either with well known diffused type guard ring 10 or without a guard ring at 11. Similarly, a well known MOS type guard ring can be provided as shown at 12.

In the event a diffused guard ring as illustrated at 10 is to be provided an $n^+$ dopant is diffused into the $p^-$ epitaxial layer 2 or a $p^+$ dopant is diffused into an $n^-$ epitaxial layer 2 through approximately provided openings in the oxide layer 3. Conventional drive-in procedures are used to complete the guard ring diffusion.

Guard ring diffusion opening is customarily filled with regrown insulation or oxide material followed by etch reopening of the metal-semiconductor contact hole 4 followed by ionic bombardment and metallization steps described above.

In the event an MOS type guard ring as illustrated at 12 is to be provided, a first opening larger than the desired contact area 4 is formed and a thin insulating or oxide layer in the magnitude of a few hundred angstroms is grown therein. Contact areas are then opened through the said thin insulating layer by conventional photoresist and etching techniques followed by ionic bombardment and metallization steps as described above.

The following specific examples will particularly illustrate the invention:

EXAMPLE I

A low-resistivity 1¼ inch diameter and 8 mil thick P-type silicon wafer was provided with an epitaxial film 3 microns thickness in accordance with standard well known thermal deposition techniques. In an oxygen atmosphere, the aforesaid wafer was oxidized to develop a silicon dioxide film of approximately 3000A thick. Applying standard photoresist masking procedures diffusion area as illustrated in FIG. 2 is opened through the insulating oxide layer using a 1:5 hydrofluoric in deionized water and an N-type dopant, phosphorous, was diffused to a $C_0$ of approximately $10^{19}$ per cubic centimeters in accordance with standard methods.

The foregoing steps for diffused type guard ring formation were followed by a regrowth of oxide whereby the aforesaid diffusion openings were refilled in accordance with reoxidation procedures and the first windows opened by the hydrofluoric acid etching procedures described above whereupon about a 500A oxide film was grown in said windows in accordance with regular oxidation methods. This procedure enables one to produce a MOS type guard ring as shown in FIGS. 2, 3, and 4.

The metal contact openings or windows 4 are then opened through the said last oxide layer utilizing standard HF etchant techniques previously mentioned. At this stage all device structures illustrated in FIGS. 2, 3, and 4 are ready for subsequent metal contact processing. The wafer is then cleaned in an ultrasonic bath using 5 min. sequential washes in acetone, trichloroethylene and isopropylalcohol followed by a quick dip in 1:20 HF and a final 20 min. deionized water rinse.

Figure 6:
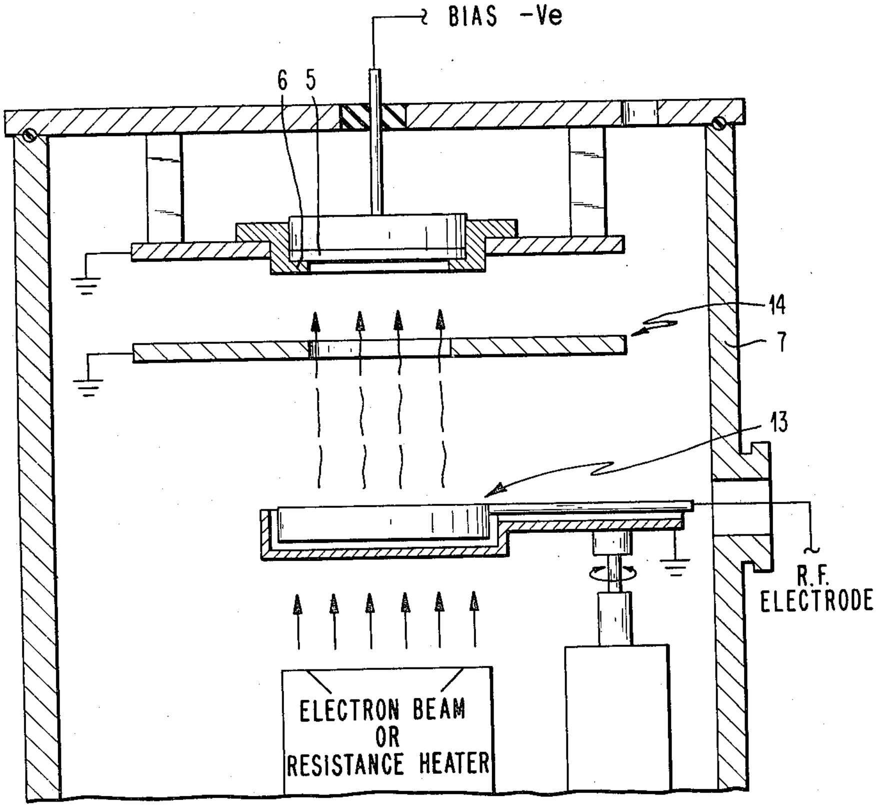
FIG. 6 is a schematic sectional view of illustrative apparatus used for the in-situ low energy ionic bombardment and metal deposition procedures.

The wafer 5 is immediately placed in the apparatus shown in FIG. 6 in a manner whereby half of said wafer is shielded on the underside by inserting a half untreated and cleaned silicon wafer permitting subsequent ionic bombardment of the exposed half only. The vacuum chamber 7 was quickly evaporated to $10^{-7}$ Torr, and concurrently therewith the said wafer 5 was heated to a temperature of about 200°C followed by an Argon bleed-in to about 2 to 10 microns. The wafer is then subjected to an ionic bombardment for from 60 to 90 minutes utilizing 25 to 50 watts RF power and a maximum DC bias of −100 volts whereupon the RF bombardment is terminated, and the apparatus is adjusted so that the wafer can be exposed to magnesium metal evaporation deposition using an electron beam gun in the apparatus evacuated between $2 \times 10^{-6}$ and $2 \times 10^{-7}$ Torr. Sintering or annealing is not necessary in the case of magnesium.

Subsequent to the deposition of the magnesium diode contact metal an evaporation deposition of aluminum for an interconnection metal was carried out. A subtractive HF etch was undertaken to define the probe contact points.

EXAMPLE II

The same procedure was followed as outlined in Example I except that the diode semiconductor metal was aluminum and as such did not require a final aluminum overlay for interconnection purposes. The aluminum contact metal was sintered at 450°C for 20 minutes in a nitrogen atmosphere.

EXAMPLE III

The same general procedure as outlined in Example I was followed using platinum as the contact metal which was sintered at 550°C for 30 minutes in nitrogen, forming platinum silicide in the contact areas. Excess unreacted platinum on the oxide overlay was etched off in aquaregia. Al contact metallurgy was then evaporated.

EXAMPLE IV

A procedure complementary to that described in Example I was followed using N-type silicon semiconductor and using platinum and aluminum as contact metals whereupon significantly improved reverse current characteristics were obtained comparable to FIG. 1B.

EXAMPLE V

A procedure complementary to that described in Example I was carried out utilizing hafnium and magnesium as contact metals and devices were obtained having rectifying characteristics as illustrated in FIG. 1B.

Figure 5:
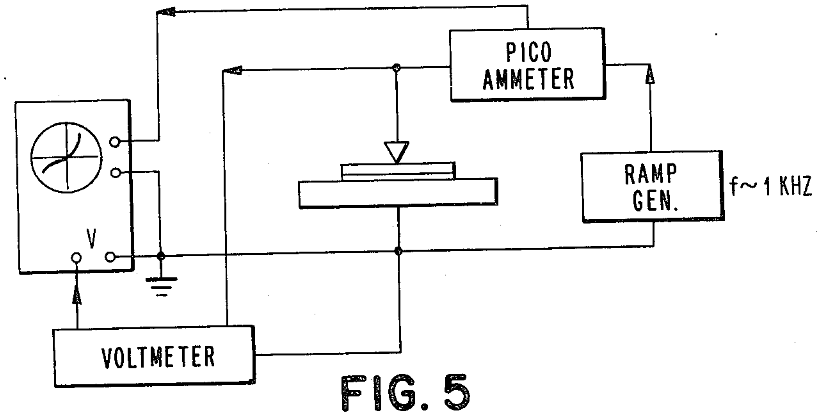
FIG. 5 is a schematic illustration of a test procedure apparatus used to determine the current voltage characteristics illustrated in FIGS. 1A and 1B.

The wafers containing the diode devices thus formed were tested utilizing the test apparatus of FIG. 5. The resulting current voltage characteristic curves are illustrated by FIGS. 1A and 1B.

The curves of 1B reveal the new reverse bias characteristics of the diode devices formed in accordance with the invention while the curves of 1A demonstrate the current voltage characteristics of the wafers processed in accordance with the prior art method.

While the invention has been particularly shown and described with reference to preferred embodiments thereof, it will be understood by those skilled in the art that various changes in form and detail may be made therein without departing from the spirit and scope of the invention.

What is claimed is:

1. In a method for producing a metal P-type semiconductor contact diode wherein said metal has a work function higher than the electron affinity of the P-type substrate, said method including the following steps:

a. providing a P-type semiconductor substrate having an epitaxial layer thereon and covered by a suitable insulating or oxide film;
b. opening a contact hole through said layer;
c. chemically pre-cleaning the contact area on said substrate;
d. sputter cleaning the contact area on said substrate by subjecting said area to low energy ionic bombardment;
e. depositing metal in said contact hole and in contact with said contact area of said semiconductor substrate, whereby the metal P-type semiconductor diode has an improved reverse current characteristic.

* * * * *